United States Patent
Chen et al.

(10) Patent No.: US 12,165,714 B2
(45) Date of Patent: Dec. 10, 2024

(54) SEMICONDUCTOR MEMORY

(71) Applicant: CSMC TECHNOLOGIES FAB2 CO., LTD., Suzhou (CN)

(72) Inventors: Bin Chen, Wuxi (CN); Youhui Li, Wuxi (CN); Ming Gu, Wuxi (CN); Xinmiao Zhao, Wuxi (CN); Hao Wang, Wuxi (CN); Shuming Guo, Wuxi (CN); Zongchuan Wang, Wuxi (CN); Nan Zhang, Wuxi (CN)

(73) Assignee: CSMC TECHNOLOGIES FAB2 CO., LTD, Jiangsu (CN)

( * ) Notice: Subject to any disclaimer, the term of this patent is extended or adjusted under 35 U.S.C. 154(b) by 254 days.

(21) Appl. No.: 17/916,927

(22) PCT Filed: Apr. 28, 2021

(86) PCT No.: PCT/CN2021/090403
§ 371 (c)(1),
(2) Date: Oct. 4, 2022

(87) PCT Pub. No.: WO2022/110639
PCT Pub. Date: Jun. 2, 2022

(65) Prior Publication Data
US 2023/0154549 A1 May 18, 2023

(30) Foreign Application Priority Data
Nov. 30, 2020 (CN) .......................... 202011378889.9

(51) Int. Cl.
G11C 16/04 (2006.01)
G11C 16/26 (2006.01)
G11C 16/30 (2006.01)

(52) U.S. Cl.
CPC .............. *G11C 16/30* (2013.01); *G11C 16/26* (2013.01)

(58) Field of Classification Search
CPC .................................. G11C 16/30; G11C 16/26
(Continued)

(56) References Cited

U.S. PATENT DOCUMENTS 5,255,240 A   10/1993  Wong
6,462,998 B1* 10/2002  Proebsting ............. G11C 7/065
                                                       365/194

(Continued)

FOREIGN PATENT DOCUMENTS

CN        103247343       8/2013
CN        205692571      11/2016

OTHER PUBLICATIONS

PCT International Search Report and Written Opinion (w/ English translation) for corresponding PCT Application No. PCT/CN2021/090403, mailed on Jun. 30, 2021, 10 pages.

*Primary Examiner* — Viet Q Nguyen
(74) *Attorney, Agent, or Firm* — Dority & Manning, P.A.

(57) ABSTRACT

A semiconductor memory, comprising a negative voltage providing unit, which is used for providing a first negative voltage to a word line during a read operation, and comprises: a clamping unit that comprises an input end, a control end and an output end, wherein the input end is coupled to a common ground end of the memory, and the control end is used for receiving a first signal; an energy storage capacitor, a first end of which is coupled to the output end, and a second end that is used for receiving a second signal; and a negative voltage providing end which is coupled to the first end, wherein the clamping unit is used for: pulling the voltage at the output end to the voltage at the input end when the first signal is "0"; and clamping the output end at a clamping voltage when the first signal is "1".

15 Claims, 2 Drawing Sheets

(58) Field of Classification Search
USPC .................................................. 365/185.18
See application file for complete search history.

(56) References Cited

U.S. PATENT DOCUMENTS

| | | | | |
|---|---|---|---|---|
| 6,631,091 | B2* | 10/2003 | Ma | G11C 29/025 |
| | | | | 365/203 |
| 7,366,051 | B2* | 4/2008 | Ueda | G11C 8/08 |
| | | | | 365/189.11 |
| 8,427,869 | B2* | 4/2013 | Lee | G11C 16/08 |
| | | | | 327/427 |
| 8,929,130 | B1* | 1/2015 | Liaw | G11C 11/419 |
| | | | | 365/156 |
| 9,142,308 | B2* | 9/2015 | Lee | G11C 16/26 |
| 9,490,794 | B1* | 11/2016 | Zhang | H03K 17/0828 |
| 9,747,966 | B2* | 8/2017 | Fujita | G11C 11/1673 |
| 11,615,859 | B2* | 3/2023 | Chung | G11C 17/165 |
| | | | | 365/96 |
| 2003/0002352 | A1 | 1/2003 | Kim | |
| 2004/0012437 | A1 | 1/2004 | Kwon et al. | |
| 2007/0008780 | A1 | 1/2007 | Jung et al. | |
| 2014/0369133 | A1 | 12/2014 | Lee | |

\* cited by examiner

SEMICONDUCTOR MEMORY

CROSS-REFERENCES TO RELATED APPLICATIONS

This application is a national phase application of International Patent Application No. PCT/CN2021/090403, filed Apr. 28, 2021, which, in turn, claims priority to Chinese Patent Application No. 2020113788899, entitled "SEMICONDUCTOR MEMORY" and filed with the Chinese Patent Office on Nov. 30, 2020, the entire contents of both of which are incorporated herein by reference.

TECHNICAL FIELD

The present disclosure relates to information storage, and in particular, to a semiconductor memory.

BACKGROUND

The statements herein merely provide background information related to the present application and do not necessarily constitute a prior art.

With an increasing data throughput and low system power consumption, a system-on-chip (SOC) has a growing demand for memory. It is predicted that by 2025, about 90% of an area of a silicon chip will be occupied by memories with different functions, and an embedded memory will become a decisive factor dominating the whole system. A non-volatile memory (such as an eflash memory) is increasingly becoming an indispensable part of the embedded memory due to the characteristic of not losing data during power failure. Then, reduction of the power consumption of an IP of the eflash memory may bring positive effects to the system.

SUMMARY

Based on the above, there is a need to provide a semiconductor memory with low power consumption.

A semiconductor memory is provided, including a memory cell, a word line (WL), a bitline (BL), and a negative voltage supply unit. The negative voltage supply unit is configured to supply the WL with a first negative voltage during a read operation. The negative voltage supply unit includes: a clamping unit including an input terminal coupled to a common ground terminal of the semiconductor memory, a control terminal configured to receive a first signal, and an output terminal; an energy storage capacitor having a first terminal coupled to the output terminal and a second terminal configured to receive a second signal; and a negative voltage supply terminal coupled to the first terminal. The clamping unit is configured to pull a voltage of the output terminal to a voltage of the input terminal when the first signal is "0", and further configured to clamp the output terminal at a clamp voltage when the first signal is "1". In the first signal and the second signal, one is a read operation enable signal of the semiconductor memory, and the other is an inverted signal of the read operation enable signal of the semiconductor memory.

Details of one or more embodiments of the present application are set forth in the following accompanying drawings and descriptions. Other features, objectives, and advantages of the present application become obvious with reference to the specification, the accompanying drawings, and the claims.

BRIEF DESCRIPTION OF THE DRAWINGS

In order to better describe and illustrate embodiments and/or examples of the disclosure, reference may be made to one or more accompanying drawings. Additional details or examples used to describe the accompanying drawings should not be considered as limitations on the scope of any of the disclosed inventions, the presently described embodiments and/or examples, and the presently understood best mode of these inventions.

DETAILED DESCRIPTION OF THE EMBODIMENTS

Figure 1:
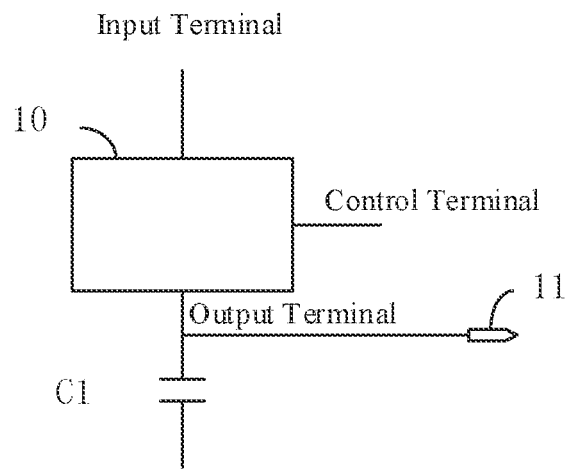
FIG. 1 is a schematic diagram illustrating a negative voltage supply unit according to an embodiment.

In order to make the objectives, technical solutions and advantages of the present disclosure clearer, the present disclosure is described in further detail below with reference to the accompanying drawings and embodiments. It should be understood that specific embodiments described herein are intended only to interpret the present disclosure and not intended to limit the present disclosure.

Unless defined otherwise, all technical and scientific terms used herein have the same meanings as would generally understood by those skilled in the technical field of the present disclosure. The terms used herein in the specification of the present disclosure are for the purpose of describing specific embodiments only, and are not intended to limit the present disclosure. The term "and/or" used herein includes any and all combinations of one or more related listed items.

It should be noted that when one element is referred to as "fixed to" another element, it may be directly disposed on the another element or an intermediate element may exist. When one element is considered to be "coupled to" another element, it may be directly coupled to the another element or an intermediate element may co-exist. The terms "vertical", "horizontal", "upper", "lower", "left", "right" and similar expressions used herein are for illustrative purposes only. When an element or layer is referred to as being "on", "adjacent to", "coupled to", or "coupled to" another element or layer, the element or layer may be directly on, adjacent to, coupled to, or coupled to the another element or layer, or an intervening element or layer may be disposed therebetween. On the contrary, when an element is referred to as being "directly on", "directly adjacent to", "directly coupled to", or "directly coupled to" another element or layer, no intervening element or layer may be disposed therebetween. It should be understood that although terms such as first, second, and third may be used to describe various elements, components, regions, layers, and/or portions, the elements, components, regions, layers, and/or portions may not be limited to such terms. Such terms are used only to distinguish one element, component, region, layer, or portion from another element, component, region, layer, or portion. Thus, without departing from the teaching of the present disclosure, a first element, component, region, layer, or portion may be referred to as a second element, component, region, layer, or portion.

The terms "include" and/or "comprise" used in the specification specify the presence of the features, integers, steps, operations, elements, and/or components, but may not exclude the presence or addition of one or more of other features, integers, steps, operations, components, and/or their combinations. The singular forms "a/an", "one", and "the" are also intended to include plural forms, unless otherwise clearly specified by the context.

Herein, a high level refers to a high voltage relative to a low level. In a digital logic circuit, the low level is represented as 0 and the high level as 1. For example, the low level may be 0 to 0.5 V, and the high level may be 2 to 5 V.

Generally, power consumption of an eflash IP is divided into active power consumption and standby power consumption. The active power consumption refers to power consumption when the eflash IP performs a read/program/erase operation. The standby power consumption refers to power consumption when the eflash IP does not perform the read/program/erase operation, commonly known as standby power consumption.

With an increasing demand for high-speed reading, a negative voltage V1N (≤−1 V) is required to be added to a WL of a flash memory in order to meet a high-speed reliable read operation. For example, V1N is generated by a charge pump. As memory capacity of the eflash IP increases and an output load capacitor of the charge pump becomes heavier, it takes longer to establish V1N. If the establishment time is longer than the entire high-speed read process, the read operation cannot be started in real time. Therefore, the read operation is required to be started in a standby mode, which increases power consumption in the standby mode.

Figure 3:
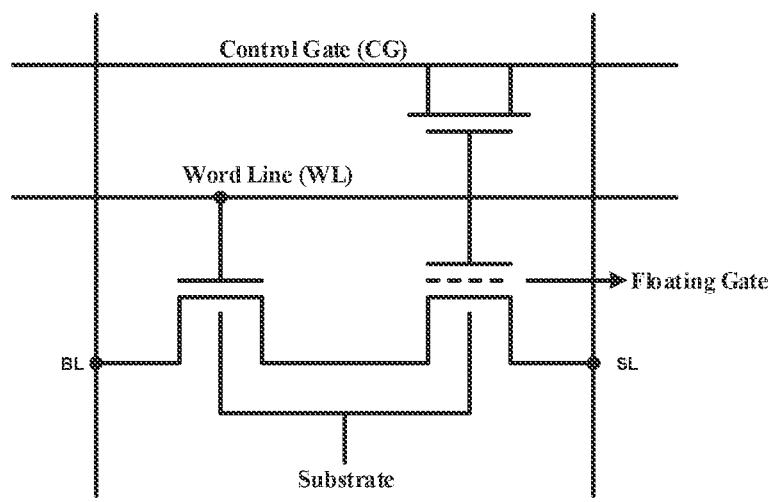
FIG. 3 is a schematic diagram illustrating a circuit structure of a memory cell according to an embodiment.

The present disclosure provides a semiconductor memory, including a memory cell, a WL, a BL, and a negative voltage supply unit. The negative voltage supply unit is configured to supply the WL with a first negative voltage during a read operation. FIG. 3 is a schematic diagram illustrating a circuit structure of a memory cell (bit cell) according to an embodiment. Each memory cell includes 5 ports, including a control gate (CG) and a WL in a transverse direction and a BL, a source line (SL), and a substrate (Sub) in a longitudinal direction. With an increasing demand for high-speed reading, in order to meet a high-speed reliable read operation, there is a need to add a negative voltage V1N (≤−1 V) to the WL, V2P5 (about 2.5 V) to the SL and VRDCG (about 1.2 V) to the CG. A reference voltage Vbg (1.2 V) may generally be generated through a bandgap reference (Bandgap), and V2P5 and VRDCG are generated respectively using the voltage Vbg through different low dropout regulators (LDOs). Since it takes some time to establish the bandgap reference and the LDO, real-time start cannot be realized in the high-speed read operation, and the operation in a standby mode is required.

FIG. 1 is a schematic diagram illustrating a negative voltage supply unit according to an embodiment. The negative voltage supply unit includes a clamping unit 10, an energy storage capacitor C1, and a negative voltage supply terminal 11. The negative voltage supply unit includes an input terminal, a control terminal, and an output terminal. The input terminal is coupled to a common ground terminal (Vss) of the semiconductor memory, the control terminal receives a first signal, and the output terminal is coupled to a first terminal of the energy storage capacitor C1. A second terminal of the energy storage capacitor C1 receives a second signal. The negative voltage supply terminal 11 is coupled to the first terminal of the energy storage capacitor C1, and serves as the output terminal of the negative voltage supply unit to supply the WL with a first negative voltage during a read operation. In the first signal and the second signal, one is a read operation enable signal re of the semiconductor memory, and the other is an inverted signal reb of the read operation enable signal of the semiconductor memory. The inverted signal reb of the read operation enable signal is "0" when the read operation enable signal re is "1". The inverted signal reb of the read operation enable signal is "1" when the read operation enable signal re is "0". The clamping unit 10 is configured to pull a voltage of the output terminal of the clamping unit 10 to a voltage (i.e., Vss) of the input terminal when the first signal is "0", and further configured to clamp the output terminal at a clamp voltage when the first signal is "1".

In an embodiment, the read operation enable signal re is "1" during the read operation and is "0" in the standby mode, the inverted signal reb of the read operation enable signal is "0" during the read operation and is "1" in the standby mode, the first signal is the read operation enable signal re, and the second signal is the inverted signal reb of the read operation enable signal. In the standby mode, the first signal is "0", the output of the negative voltage supply terminal 11 is Vss, and a voltage (second signal) of the second terminal of the energy storage capacitor C1 is "1". During the read operation, the voltage of the second terminal of the energy storage capacitor C1 flips from "1" to "0", and when the first signal is "1", the output terminal of the clamping unit 10 is clamped at a clamp voltage.

In another embodiment, the read operation enable signal re is "0" during the read operation and is "1" in the standby mode, the inverted signal reb of the read operation enable signal is "1" during the read operation and is "0" in the standby mode, the second signal is the read operation enable signal re, and the first signal is the inverted signal reb of the read operation enable signal. In the standby mode, the first signal is "0", the output of the negative voltage supply terminal 11 is Vss, and a voltage (second signal) of the second terminal of the energy storage capacitor C1 is "1". During the read operation, the voltage of the second terminal of the energy storage capacitor C1 flips from "1" to "0", and when the first signal is "1", the output terminal of the clamping unit 10 is clamped at a clamp voltage.

In the semiconductor memory, when the first signal is "0", the output terminal of the clamping unit 10 is pulled to the common ground terminal, and the negative voltage supply unit has no static DC power consumption. When the first signal flips from "0" to "1", the voltage of the second terminal of the energy storage capacitor C1 flips from "1" to "0", and taking advantage of the fact that a voltage difference between two terminals of the capacitor does not change abruptly, the voltage of the first terminal of the energy storage capacitor C1 becomes a negative voltage, and the voltage of the first terminal of the energy storage capacitor C1 (i.e., the output terminal of the clamping unit 10) is clamped at the clamp voltage. Afterwards, the voltage of the first terminal of the energy storage capacitor C1 and output load (the output load may be equivalent to a load capacitor) of the negative voltage supply unit 11 complete charge sharing. On the premise that no static DC power consumption occurs in the standby mode (thus the power consumption of semiconductor memory can be reduced), the negative voltage output by the negative voltage supply terminal can be quickly established, which can realize real-time startup and meet conditions of the high-speed read operation of the semiconductor memory. Besides, the first negative voltage supplied by the negative voltage supply unit can be limited to a controllable range by the clamping unit.

In an embodiment, the clamping unit 10 includes:
    a first switching transistor, the first switching transistor having an input terminal serving as the input terminal of the clamping unit and a controlled terminal configured to receive the second signal;

a second switching transistor having an input terminal coupled to an output terminal of the first switching transistor and an output terminal serving as the output terminal of the clamping unit;

a third switching transistor having an input terminal coupled to the output terminal of the first switching transistor, a controlled terminal configured to receive the first signal, and an output terminal coupled to a controlled terminal of the second switching transistor; and a fourth switching transistor having an input terminal configured to receive a high-level signal, a controlled terminal configured to receive the first signal, and an output terminal coupled to the controlled terminal of the second switching transistor.

Each of the first switching transistor, the second switching transistor, and the third switching transistor is a first-type switching transistor, and the fourth switching transistor is a second-type switching transistor. The first-type switching transistor is turned on when a voltage of a controlled terminal of the first-type switching transistor is greater than a first threshold voltage of an output terminal of the first-type switching transistor, and the second-type switching transistor is turned on when a voltage of a controlled terminal of the second-type switching transistor is less than a second threshold voltage of an input terminal of the second-type switching transistor.

Figure 2:
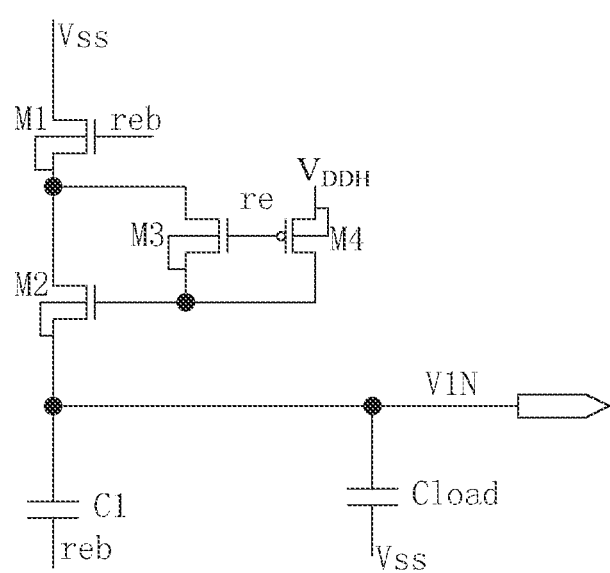
FIG. 2 is a schematic circuit diagram illustrating the negative voltage supply unit according to an embodiment.

FIG. 2 is a schematic circuit diagram illustrating the negative voltage supply unit according to an embodiment, including a N-channel metal oxide semiconductor (NMOS) transistor M1, an NMOS transistor M2, an NMOS transistor M3, a P-channel metal oxide semiconductor (PMOS) transistor M4, and an energy storage capacitor C1. The NMOS transistor M1 has a drain coupled to the common ground terminal (Vss) of the semiconductor memory, a gate receiving the inverted signal reb of the read operation enable signal of the semiconductor memory, and a source coupled to a drain of the NMOS transistor M2 and a drain of the NMOS transistor M3. A gate of the NMOS transistor M2 is coupled to a source of the NMOS transistor M3 and a drain of the PMOS transistor M4. A source of the NMOS transistor M2 is coupled to one terminal of the energy storage capacitor C1, and serves as the output terminal of the negative voltage supply unit to output the first negative voltage V1N. The other end of the energy storage capacitor C1 receives the inverted signal reb of the read operation enable signal. A gate of the NMOS transistor M3 is coupled to a gate of the PMOS transistor M4, and receives the read operation enable signal re of the semiconductor memory. A source of the PMOS transistor M4 receives a high-level signal, which is a power supply voltage $V_{DDH}$ in the embodiment shown in FIG. 2.

In an embodiment, the semiconductor memory is a flash memory, for example, an eflash. In FIG. 2, a load capacitor Cload is illustrated at the output terminal of the negative voltage supply unit, which is used to represent the load capacitor equivalent to the output load of V1N. Specific operating states in the embodiment shown in FIG. 2 are analyzed as follows.

1) In the standby mode, if the read operation enable signal re is "0", the inverted signal reb of the read operation enable signal is "1", the NMOS transistor M1, the NMOS transistor M2, and the PMOS transistor M4 are turned on, the voltage of the output terminal of the negative voltage supply unit is pulled to a drain voltage of the NMOS transistor M1, i.e., Vss, and no static DC power consumption occurs.

2) During a program operation or an erase operation, the read operation enable signal re is still "0", as in the standby mode. No static DC power consumption occurs.

3) In the read operation, the read operation enable signal re may change from "0" to "1", and then the inverted signal reb of the read operation enable signal may change from "1" to "0". Since the voltage difference between two terminals of the capacitor does not change abruptly, a voltage value of V1N (Vss in the standby mode) may vary (decrease) with the inverted signal reb of the read operation enable signal. A decreased value is a voltage difference between "1" and "0" of the inverted signal reb of the read operation enable signal, which is the power supply voltage $V_{DDH}$ in this embodiment. Then, the energy storage capacitor C1 and the load capacitor Cload complete capacitor charge sharing. The process is fast and can be understood to be completed simultaneously with the flipping of the read operation enable signal re during the read operation. A voltage Vx of the voltage value of V1N after charge sharing may be calculated according to the following formula:

$$Vx = -C1 * V_{DDH}/(C1 + C\text{load})$$

where $V_{DDH}$ denotes voltage of the power supply; C1 denotes capacitance of the energy storage capacitor, and Cload denotes capacitance of the load capacitor. Vx is designed to be a minimum voltage value that can meet a design requirement at the minimum $V_{DDH}$ voltage, and Vx≤−1 V is required in one embodiment. Vx can meet the requirement by selecting an appropriate storage capacitor C1. Moreover, since the inverted signal reb of the read operation enable signal is "0" and the read operation enable signal re is "1", the NMOS transistor M3 is turned on, the NMOS transistor M1 and the NMOS transistor M2 form a clamp circuit, and a final voltage may be clamped near a negative of a sum of threshold voltages of the NMOS transistor M1 and the NMOS transistor M2 (if the threshold voltages of the NMOS transistor M1 and the NMOS transistor M2 are both Vth, the final voltage is clamped at −2Vth, about −1.4 V), so as to limit the negative voltage of V1N to a controllable range. The negative voltage of V1N is established quickly, which can realize real-time startup and meet conditions of the high-speed read operation of the eflash IP. Besides, the negative voltage supply unit has a simple circuit structure, thereby reducing complexity of chip design.

In the description of the specification, reference terms such as "some embodiments", "other embodiments", and "ideal examples" mean that a particular feature, structure, material, or feature described in connection with the embodiment or example is included in at least one embodiment or example of the present disclosure. In the specification, the schematic expressions to the above terms are not necessarily referring to the same embodiment or example.

The technical features in the above embodiments may be randomly combined. For concise description, not all possible combinations of the technical features in the above embodiments are described. However, all the combinations of the technical features are to be considered as falling within the scope described in this specification provided that they do not conflict with each other.

The above embodiments only describe several implementations of the present disclosure, and their description is specific and detailed, but cannot therefore be understood as a limitation on the patent scope of the present disclosure. It should be noted that those of ordinary skill in the art may further make variations and improvements without departing from the conception of the present disclosure, and these all fall within the protection scope of the present disclosure.

Therefore, the patent protection scope of the present disclosure should be subject to the appended claims.

What is claimed is:

1. A semiconductor memory, comprising a memory cell, a word line (WL), a bitline (BL), and a negative voltage supply unit, the negative voltage supply unit being configured to supply the WL with a first negative voltage during a read operation, the negative voltage supply unit comprising:
   a clamping unit including an input terminal coupled to a common ground terminal of the semiconductor memory, a control terminal configured to receive a first signal, and an output terminal;
   an energy storage capacitor having a first terminal coupled to the output terminal and a second terminal configured to receive a second signal; and
   a negative voltage supply terminal coupled to the first terminal;
   wherein the clamping unit is configured to pull a voltage of the output terminal to a voltage of the input terminal when the first signal is "0", and further configured to clamp the output terminal at a clamp voltage when the first signal is "1"; and
   wherein in the first signal and the second signal, one is a read operation enable signal of the semiconductor memory, and the other is an inverted signal of the read operation enable signal of the semiconductor memory.

2. The semiconductor memory according to claim 1, wherein the first signal is the read operation enable signal, and the second signal is the inverted signal of the read operation enable signal.

3. The semiconductor memory according to claim 2, wherein the clamping unit includes:
   a first switching transistor, the first switching transistor having an input terminal serving as the input terminal of the clamping unit, and a controlled terminal configured to receive the second signal;
   a second switching transistor having an input terminal coupled to an output terminal of the first switching transistor, and an output terminal serving as the output terminal of the clamping unit;
   a third switching transistor having an input terminal coupled to the output terminal of the first switching transistor, a controlled terminal configured to receive the first signal, and an output terminal coupled to a controlled terminal of the second switching transistor; and
   a fourth switching transistor having an input terminal configured to receive a high-level signal, a controlled terminal configured to receive the first signal, and an output terminal coupled to the controlled terminal of the second switching transistor;
   wherein each of the first switching transistor, the second switching transistor, and the third switching transistor is a first-type switching transistor, the fourth switching transistor is a second-type switching transistor, the first-type switching transistor is turned on when a voltage of a controlled terminal of the first-type switching transistor is greater than a first threshold voltage of an output terminal of the first-type switching transistor, and the second-type switching transistor is turned on when a voltage of a controlled terminal of the second-type switching transistor is less than a second threshold voltage of an input terminal of the second-type switching transistor.

4. The semiconductor memory according to claim 3, wherein
   the first switching transistor is a N-channel metal oxide semiconductor (NMOS) transistor, the input terminal of the first switching transistor is a drain, the controlled terminal of the first switching transistor is a gate, and the output terminal of the first switching transistor is a source;
   the second switching transistor is an NMOS transistor, the input terminal of the second switching transistor is a drain, the controlled terminal of the second switching transistor is a gate, and the output terminal of the second switching transistor is a source;
   the third switching transistor is an NMOS transistor, the input terminal of the third switching transistor is a drain, the controlled terminal of the third switching transistor is a gate, and the output terminal of the third switching transistor is a source; and
   the fourth switching transistor is a P-channel metal oxide semiconductor (PMOS) transistor, the input terminal of the fourth switching transistor is a source, the controlled terminal of the fourth switching transistor is a gate, and the output terminal of the fourth switching transistor is a drain.

5. The semiconductor memory according to claim 4, wherein the clamp voltage is a negative of a sum of a threshold voltage of the first switching transistor and a threshold voltage of the second switching transistor.

6. The semiconductor memory according to claim 4, wherein the clamp voltage is −1.4 V.

7. The semiconductor memory according to claim 2, wherein the read operation enable signal is "0" when the semiconductor memory is in a standby mode.

8. The semiconductor memory according to claim 7, wherein the read operation enable signal is "1" when the semiconductor memory is during the read operation.

9. The semiconductor memory according to claim 1, further comprising a source line and a control gate.

10. The semiconductor memory according to claim 9, wherein the memory cell further includes a substrate.

11. The semiconductor memory according to claim 9, further comprising a first voltage supply unit and a second voltage supply unit, the first voltage supply unit being configured to apply a voltage of 2.5 V to the source line during the read operation, and the second voltage supply unit being configured to apply a voltage of 1.2 V to the control gate during the read operation.

12. The semiconductor memory according to claim 7, wherein the read operation enable signal is "0" when the semiconductor memory is during a program operation or an erase operation.

13. The semiconductor memory according to claim 1, wherein the second signal is the read operation enable signal, and the first signal is the inverted signal of the read operation enable signal; the read operation enable signal is "0" when the semiconductor memory is during the read operation; and the read operation enable signal is "1" when the semiconductor memory is in a standby mode.

14. The semiconductor memory according to claim 1, wherein the semiconductor memory is a flash memory.

15. The semiconductor memory according to claim 1, wherein the semiconductor memory is an embedded flash memory.

* * * * *